(12) United States Patent
Kumar

(10) Patent No.: US 10,090,815 B2
(45) Date of Patent: Oct. 2, 2018

(54) COMMON-MODE FEEDBACK FOR DIFFERENTIAL AMPLIFIER

(71) Applicant: STMicroelectronics International N.V, Amsterdam (NL)

(72) Inventor: Ashish Kumar, Ghaziabad (IN)

(73) Assignee: STMICROELECTRONICS INTERNATIONAL N.V, Amsterdam (NL)

( * ) Notice: Subject to any disclaimer, the term of this patent is extended or adjusted under 35 U.S.C. 154(b) by 47 days.

(21) Appl. No.: 15/393,713

(22) Filed: Dec. 29, 2016

(65) Prior Publication Data

US 2018/0069513 A1    Mar. 8, 2018

(30) Foreign Application Priority Data

Sep. 8, 2016    (IN) .............................. 201611030761

(51) Int. Cl.
  *H03F 1/34*    (2006.01)
  *H03F 3/45*    (2006.01)
  *H03F 1/02*    (2006.01)

(52) U.S. Cl.
  CPC ....... *H03F 3/45071* (2013.01); *H03F 1/0205* (2013.01); *H03F 1/34* (2013.01); *H03F 3/45183* (2013.01); *H03F 3/45475* (2013.01); *H03F 3/45479* (2013.01); *H03F 3/45659* (2013.01); *H03F 2200/471* (2013.01)

(58) Field of Classification Search
  CPC .......... H03F 1/34; H03F 3/45; H03F 3/45183; H03F 3/45479; H03F 3/45071; H03F 1/0205

USPC .................................................. 330/258, 260
See application file for complete search history.

(56) References Cited

U.S. PATENT DOCUMENTS

| | | | | |
|---|---|---|---|---|
| 5,187,448 | A * | 2/1993 | Brooks | H03F 3/45183 330/258 |
| 6,107,882 | A * | 8/2000 | Gabara | H03F 3/45183 330/258 |
| 6,617,888 | B2 * | 9/2003 | Volk | H04L 25/0274 330/258 |
| 6,998,917 | B2 * | 2/2006 | Kudo | H03F 3/45192 330/258 |
| 7,564,306 | B2 * | 7/2009 | Lee | H03F 1/08 330/258 |

(Continued)

*Primary Examiner* — Khanh V Nguyen
(74) *Attorney, Agent, or Firm* — Slater Matsil, LLP

(57) ABSTRACT

An embodiment circuit includes an operational amplifier having a first output terminal and a second output terminal. The circuit further includes a detector coupled between the first output terminal and the second output terminal of the operational amplifier. The detector is configured to detect a common-mode output voltage at the first output terminal and the second output terminal of the operational amplifier. The circuit also includes a feedback amplifier having a first input terminal coupled to the detector and a second input terminal configured to receive a reference voltage. The feedback amplifier is configured to generate a feedback signal based on the common-mode output voltage and the reference voltage and to provide the feedback signal to the operational amplifier. The circuit additionally includes an impedance element having a first terminal coupled to the first input terminal of the feedback amplifier and a second terminal coupled to a supply voltage.

22 Claims, 10 Drawing Sheets

(56) References Cited

U.S. PATENT DOCUMENTS

| | | | | |
|---|---|---|---|---|
| 8,138,833 B1* | 3/2012 | Kumar | ............... | H03F 3/45183 330/258 |
| 2008/0284513 A1* | 11/2008 | Chang | ............... | H03F 3/45188 330/258 |
| 2009/0251216 A1* | 10/2009 | Giotta | ............... | H03F 3/45179 330/258 |

* cited by examiner

COMMON-MODE FEEDBACK FOR DIFFERENTIAL AMPLIFIER

CROSS-REFERENCE TO RELATED APPLICATIONS

This application claims priority to Indian Patent Application 201611030761, which was filed on Sep. 8, 2016, and entitled "Common-Mode Feedback for Differential Amplifier," which application is incorporated herein by reference.

TECHNICAL FIELD

The present disclosure relates generally to differential amplifiers, and, in particular embodiments, to a differential amplifier with a common-mode feedback circuit.

BACKGROUND

Operational amplifiers having a differential output require an accurate common-mode feedback loop in order to set the common-mode output voltage of the amplifier. The basic principle of operation for a common-mode feedback circuit is that the common-mode voltage is sensed and compared to a reference thereby generating a difference or "error" signal. The error signal is fed back into the main amplifier, and the common-mode of the amplifier is set equal to the reference voltage, and consequently, the error is eliminated or substantially reduced.

SUMMARY

According to an embodiment, a circuit includes an operational amplifier having a first output terminal and a second output terminal. The circuit further includes a detector coupled between the first output terminal and the second output terminal of the operational amplifier. The detector is configured to detect a common-mode output voltage at the first output terminal and the second output terminal of the operational amplifier. The circuit also includes a feedback amplifier having a first input terminal coupled to the detector and a second input terminal configured to receive a reference voltage. The feedback amplifier is configured to generate a feedback signal based on the common-mode output voltage and the reference voltage and to provide the feedback signal to the operational amplifier. The circuit additionally includes an impedance element having a first terminal coupled to the first input terminal of the feedback amplifier and a second terminal coupled to a supply voltage.

According to an embodiment, a method includes detecting a common-mode output voltage at a first output terminal and a second output terminal of an operational amplifier, and attenuating the common-mode output voltage according to a voltage division to produce an attenuated common-mode output voltage. The method further includes generating a control signal based on a comparison of the attenuated common-mode output voltage with a reference voltage generated according to the voltage division, and providing the control signal to the operational amplifier, where the operational amplifier is configured to vary the common-mode output voltage based on the control signal.

According to an embodiment, a circuit includes a differential amplifier having a first output terminal and a second output terminal. The differential amplifier has a first stage configured to receive an input voltage, and a second stage configured to amplify an output of the first stage and generate an output signal at the first output terminal and the second output terminal of the differential amplifier. The circuit also includes a common-mode detector coupled between the first output terminal and the second output terminal. The common-mode detector is configured to detect a common-mode output voltage of the output signal at a first pair of input terminals of the common-mode detector. The circuit further includes an impedance element coupled between an output node of the common-mode detector and an supply voltage and an error amplifier having a first terminal coupled to the output node of the common-mode detector. The error amplifier is configured to receive a reference voltage at a second terminal of the error amplifier, where the error amplifier is further configured to provide a control signal to the first stage of the differential amplifier based on a difference between the reference voltage and a voltage at the output node of the common-mode detector.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Operational amplifiers having a differential output require an accurate common-mode feedback loop in order to set the common-mode output voltage of the amplifier. Common-mode feedback (CMFB) circuits and methods of stabilizing CMFB circuits are provided in accordance with various embodiments. Some embodiments may achieve advantages. Embodiments provide a CMFB circuit for a differential amplifier that has a stable CMFB loop and that, in comparison to conventional CMFB methods or circuits, is simple in architecture, occupies less area, consumes less power, has small common-mode error, has a high-gain error amplifier, and in which settling of the differential loop is not affected.

Figure 1:
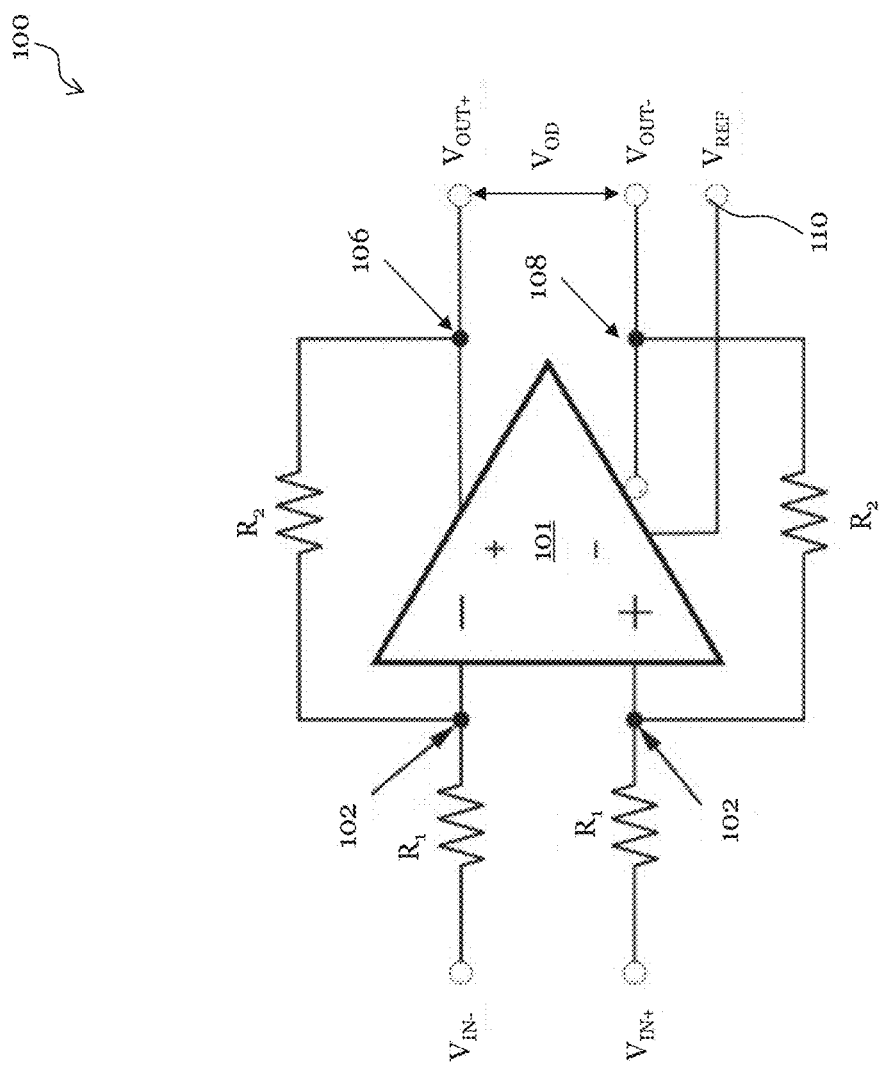
FIG. 1 shows a fully differential amplifier including an operational amplifier (op-amp)

FIG. 1 shows a differential amplifier 100 having an operational amplifier (op-amp) 101 with a first input terminal 102, a second input terminal 104, a first output terminal 106, and a second output terminal 108. First input terminal 102 may be an inverting input terminal of op-amp 101, while second input terminal 104 may be a non-inverting input terminal of op-amp 101. First output terminal 106 may be a non-inverting output terminal of op-amp 101, while second output terminal 108 may be an inverting input terminal of op-amp 101.

As shown in FIG. 1, a first one of first resistive element R1 may be coupled to first input terminal 102. In particular, a first terminal of first resistive element R1 may be coupled to (e.g. tied to) first input terminal 102, while a second terminal of first resistive element R1 may be coupled to a first input voltage $V_{IN-}$. FIG. 1 also shows that first output terminal 106 and first input terminal 102 are coupled by a first one of second resistive element R2. In particular, a first terminal of second resistive element R2 may be coupled to (e.g. tied to) first input terminal 102, while a second terminal of second resistive element R2 may be coupled to (e.g. tied to) first output terminal 106.

In like manner, a second one of first resistive element R1 may be coupled to second input terminal 104. In particular, a first terminal of first resistive element R1 may be coupled to (e.g. tied to) second input terminal 104, while a second terminal of first resistive element R1 may be coupled to a second input voltage $V_{IN+}$. FIG. 1 also shows that second output terminal 108 and second input terminal 104 are coupled by a second one of second resistive element R2. In particular, a first terminal of second resistive element R2 may be coupled to (e.g. tied to) second input terminal 104, while a second terminal of second resistive element R2 may be coupled to (e.g. tied to) second output terminal 108.

As shown in FIG. 1, the output voltages at first output terminal 106 and second output terminal 108 may be denoted as $V_{OUT+}$ and $V_{OUT-}$, respectively. Op-amp 101 may be configured such that its output is differential. For example, the output of op-amp 101 is taken as the potential difference between $V_{OUT+}$ and $V_{OUT-}$, which may be denoted as output differential voltage $V_{OD}$, which is equal to $(V_{OUT+}-V_{OUT-})$. Op-amp 101 may further include an input terminal 110 configured to receive a common-mode reference voltage $V_{REF}$. The common-mode reference voltage $V_{REF}$, provided at input terminal 110, serves to set a common-mode output voltage $V_{CMO}$ of op-amp 101 (depicted in FIG. 2). Common-mode output voltage $V_{CMO}$ can be controlled independently of the output differential voltage $V_{OD}$ based on common-mode reference voltage $V_{REF}$.

Figure 2:
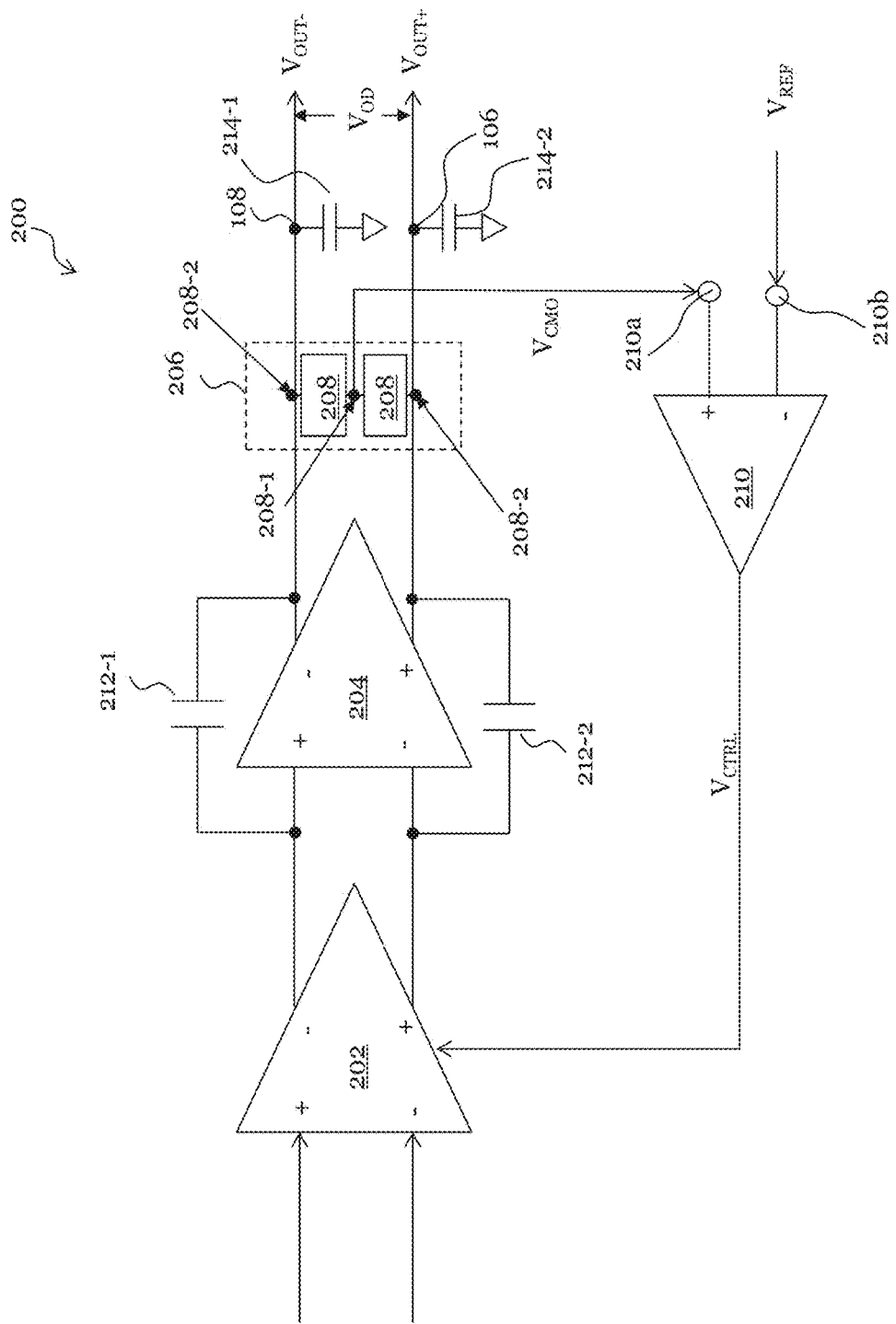
FIG. 2 shows a first example circuit of the op-amp shown in FIG. 1.

FIG. 2 shows a first example of the internal circuitry 200 of op-amp 101 shown in FIG. 1. The internal circuitry 200 includes elements that are configured to control common-mode output voltage $V_{CMO}$ of op-amp 101 based on common-mode reference voltage $V_{REF}$. In the example of FIG. 2, op-amp 101 includes a two-stage amplifier having a first stage 202 and a second stage 204. Each of the first stage 202 and second stage 204 of the two-stage amplifier may be an operational transconductance amplifier (OTA). In comparison to a single-stage amplifier (e.g. where the gain is limited to the transconductance gain of a differential pair), the two-stage amplifier shown in FIG. 2 provides larger gain, larger signal swing. For example, the gain of the two-stage amplifier shown in FIG. 2 may be up to about 100 times the gain of a single-stage. This increase in gain is useful in differential amplifier 100 (shown in FIG. 1). It is noted that a stability of the feedback loop of differential amplifier 100 is driven by a gain point (1/β), where β is feedback factor and is equal to R1/(R1+R2). The increase in gain achieved by the two-stage amplifier shown in FIG. 2 also results in a reduction in a common-mode error voltage, which may be the difference between the common-mode output voltage $V_{CMO}$ and the common-mode reference voltage $V_{REF}$ (e.g. described below in respect of FIG. 2). In some examples, first stage 202 may be a high gain stage, while second stage 204 may be a low gain stage that provides large signal swings. In the example of FIG. 2, second stage 204 may provide output voltages $V_{OUT+}$ and $V_{OUT-}$ of op-amp 101.

The voltages $V_{OUT+}$ and $V_{OUT-}$ at the outputs of second stage 204 may be expressed in terms of common-mode output voltage $V_{CMO}$ and output differential voltage $V_{OD}$. In particular, $V_{OUT+}$ at the non-inverting output of second stage 204 may be expressed as $(V_{CMO}+V_{OD}/2)$, while $V_{OUT-}$ at the inverting output of second stage 204 may be expressed as $(V_{CMO}-V_{OD}/2)$.

As shown in the example of FIG. 2, internal circuitry 200 of op-amp 101 includes a common-mode detector 206 coupled to second stage 204. In particular, each of output voltages $V_{OUT+}$ and $V_{OUT-}$ is fed as an input into common-mode detector 206. The output voltages $V_{OUT+}$ and $V_{OUT-}$ are averaged by common-mode detector 206 to yield common-mode output voltage $V_{CMO}$, which is an output of common-mode detector 206. In some examples, common-mode detector 206 may include impedance elements 208, which may include one or more resistive elements, one or more capacitive elements, one or more differential difference amplifiers (DDA), combinations thereof, or the like. As an example, impedance elements 208 may include one or more switched capacitors. As another example, impedance elements 208 may be resistors, in which case common-mode detector 206 may be a resistor-averaging circuit. In some examples, each of impedance elements 208 can include a resistive element, a capacitive element (e.g. a switched capacitor), an inductive element, or combinations thereof. In some examples, each of impedance elements 208 can include one or more resistors connected in series or in parallel, one or more capacitors connected in series or in parallel, or a combination thereof.

In the example shown in FIG. 2, first terminals 208-1 of a first one and a second one of impedance elements 208 are tied to each other. In addition, a second terminal 208-2 of the first one of impedance elements 208 is coupled to (e.g. tied to) the inverting output of second stage 204, while a second terminal 208-2 of the second one of impedance elements 208 is coupled to (e.g. tied to) the non-inverting output of second stage 204. In the example of FIG. 2, common-mode output voltage $V_{CMO}$ is outputted from common-mode detector 206 at the node formed by first terminals 208-1 of the first one and the second one of impedance elements 208.

Internal circuitry 200 also includes a common-mode feedback (CMFB) amplifier 210. In some examples, CMFB amplifier 210 may include, or may be, an error amplifier. As shown in FIG. 2, CMFB amplifier 210 receives common-mode output voltage $V_{CMO}$ at a first input terminal 210a and common-mode reference voltage $V_{REF}$ at a second input terminal 210b. As such, first input terminal 210a of CMFB amplifier 210 may be coupled to (e.g. tied to) first terminals 208-1 of the first one and the second one of impedance elements 208 that are tied to each other.

CMFB amplifier 210 compares common-mode output voltage $V_{CMO}$ with common-mode reference voltage $V_{REF}$, and generates a common-mode error voltage $V_{ERR}$ based on the comparison. In particular, CMFB amplifier 210 may be configured to maintain or set common-mode output voltage $V_{CMO}$ at the same voltage applied to second input terminal 210b (namely, common-mode reference voltage $V_{REF}$) by comparing common-mode reference voltage $V_{REF}$ to common-mode output voltage $V_{CMO}$ (e.g. to determine common-mode error voltage $V_{ERR}$) and by adjusting a control signal $V_{CTRL}$ fed back to first stage 202 so that common-mode output voltage $V_{CMO}$ (e.g. at first terminals 208-1 of the first one and the second one of impedance elements 208) is set or maintained at the common-mode reference voltage $V_{REF}$. As an example, the control signal $V_{CTRL}$ may vary an output current of op-amp 101, thereby adjusting common-mode output voltage $V_{CMO}$ to common-mode reference voltage $V_{REF}$. In some examples, common-mode detector 206 and CMFB amplifier 210 may collectively form a CMFB circuit of op-amp 101.

Common mode of op-amp 101 needs to be compensated. If common mode of op-amp 101 is not compensated, a noise injection into common-mode output voltage $V_{CMO}$ may cause common-mode output voltage $V_{CMO}$ to ring or oscillate. Usually, the compensation method for common mode of op-amp 101 can be classified as source degeneration and current reduction. Source degeneration compensation may include coupling a resistor between two transistors at input terminals 210a and 210b of CMFB amplifier 210, thereby enhancing stability by reducing the gain of CMFB amplifier 210. Current reduction compensation may include reducing the amount of the control current of first stage 202 to 1/N (where N is an integer and N>>1), thereby enhancing circuit stability. Source degeneration and current reduction, however, sacrifice larger gain and larger bandwidth in order to obtain stability. In other words, increased circuit stability comes at the expense of lower gain and reduced bandwidth.

Stability may also be achieved by dominant-pole compensation, which is a form of lag compensation. A pole placed at an appropriate low frequency in an open-loop response of op-amp 101 may reduce the gain of op-amp 101 to one (0 decibels (dB)) for a frequency at or just below the location of the next highest frequency pole. The lowest frequency pole is called the dominant pole because it dominates the effect of all of the higher frequency poles. The result is that the difference between an open loop output phase of op-amp 101 and the phase response of a feedback network having no reactive elements does not fall below −180° when op-amp 101 has a gain of one or more, thus ensuring stability. Dominant-pole compensation may result in the concurrent phenomenon of pole splitting, in which the lowest frequency pole of an uncompensated op-amp 101 "moves" to an even lower frequency to become the dominant pole, and a higher-frequency pole of an uncompensated op-amp 101 "moves" to a higher frequency.

One way of implementing dominant-pole compensation is to couple a miller-compensation capacitor between an output of first stage 202 and an output of second stage 204. As an example, as shown in FIG. 2, a first terminal of a first miller-compensation capacitor 212-1 is coupled (e.g. tied to) an inverting output of first stage 202, while a second terminal of the first miller-compensation capacitor 212-1 is coupled (e.g. tied to) an inverting output of second stage 204. In like manner, a first terminal of a second miller-compensation capacitor 212-2 is coupled (e.g. tied to) a non-inverting output of first stage 202, while a second terminal of the second miller-compensation capacitor 212-2 is coupled (e.g. tied to) a non-inverting output of second stage 204.

The capacitances of miller-compensation capacitors 212-1 and 212-2 may be equal to each other. Use of miller-compensation capacitors 212-1, 212-2 may, however, reduce the bandwidth of op-amp 101, thereby reducing available open loop gain at higher frequencies. This, in turn, reduces the amount of feedback available for distortion correction at higher frequencies. In addition, use of miller-compensation capacitors 212-1, 212-2 reduces a slew rate of op-amp 101. This reduction may result from the time it takes a finite current driving a compensated op-amp 101 to charge miller-compensation capacitors 212-1, 212-2. This may result is the inability of op-amp 101 to accurately reproduce a high amplitude, rapidly changing signal. In some cases, e.g. in low β circuits where differential loop's stability is driven by gain point (1/β) and β<1, reducing a capacitance of miller-compensation capacitors 212-1, 212-2 can recover lost bandwidth. However, this comes at the expense of common mode loop's stability. In this scenario, stability of op-amp 101 may be in jeopardy since the feedback loop formed by CMFB circuit (including common-mode detector 206 and CMFB amplifier 210) may be operating close to a unity feedback factor (e.g. β=1).

Figure 3:
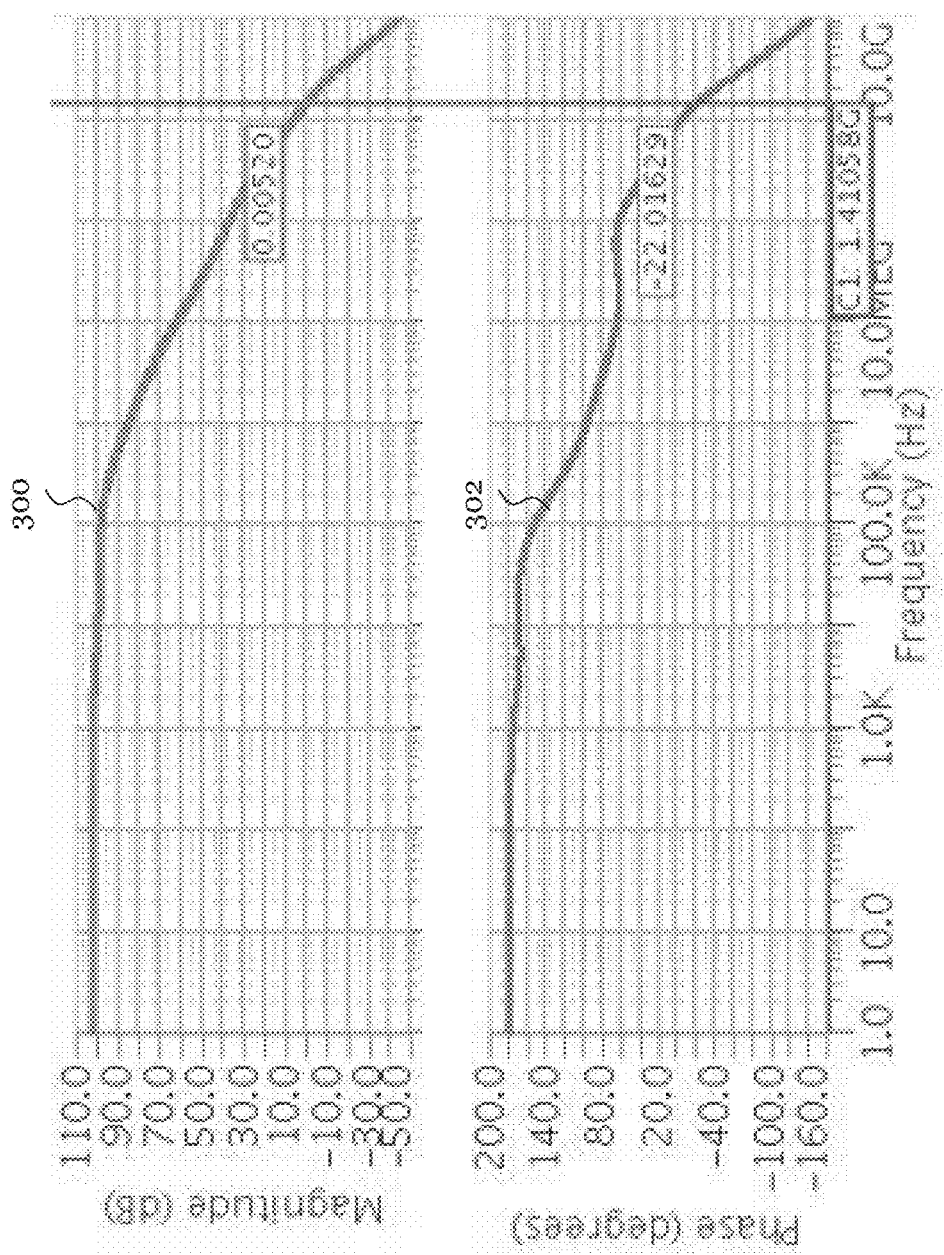
FIG. 3 shows a common mode frequency response of the circuit shown in FIG. 2.

FIG. 3 shows a common mode loop's frequency response of the internal circuitry 200 shown in FIG. 2, including a magnitude response 300 and a phase response 302. The horizontal axes of both magnitude response 300 and phase response 302 are logarithmic scales indicating frequency in Hertz. The vertical axis of magnitude response 300 is a linear scale indicating gain in decibels, while the vertical axis of phase response 302 is a linear scale indicating phase in degrees. In particular, the common mode loop's magnitude response 300 and the phase response 302 of internal circuitry 200 show that a phase margin (e.g. the value of the phase response when gain is 0 dB) is between about −20 degrees and −25 degrees (e.g. about −22 degrees). In general, a phase margin of about 45 degrees or more (e.g. about 50 degrees or more) may be needed for stability. As such, the op-amp 101 may have an unstable feedback loop formed by common-mode detector 206 and CMFB amplifier 210. A CMFB circuit that provides a stable feedback loop may be needed.

Figure 4:
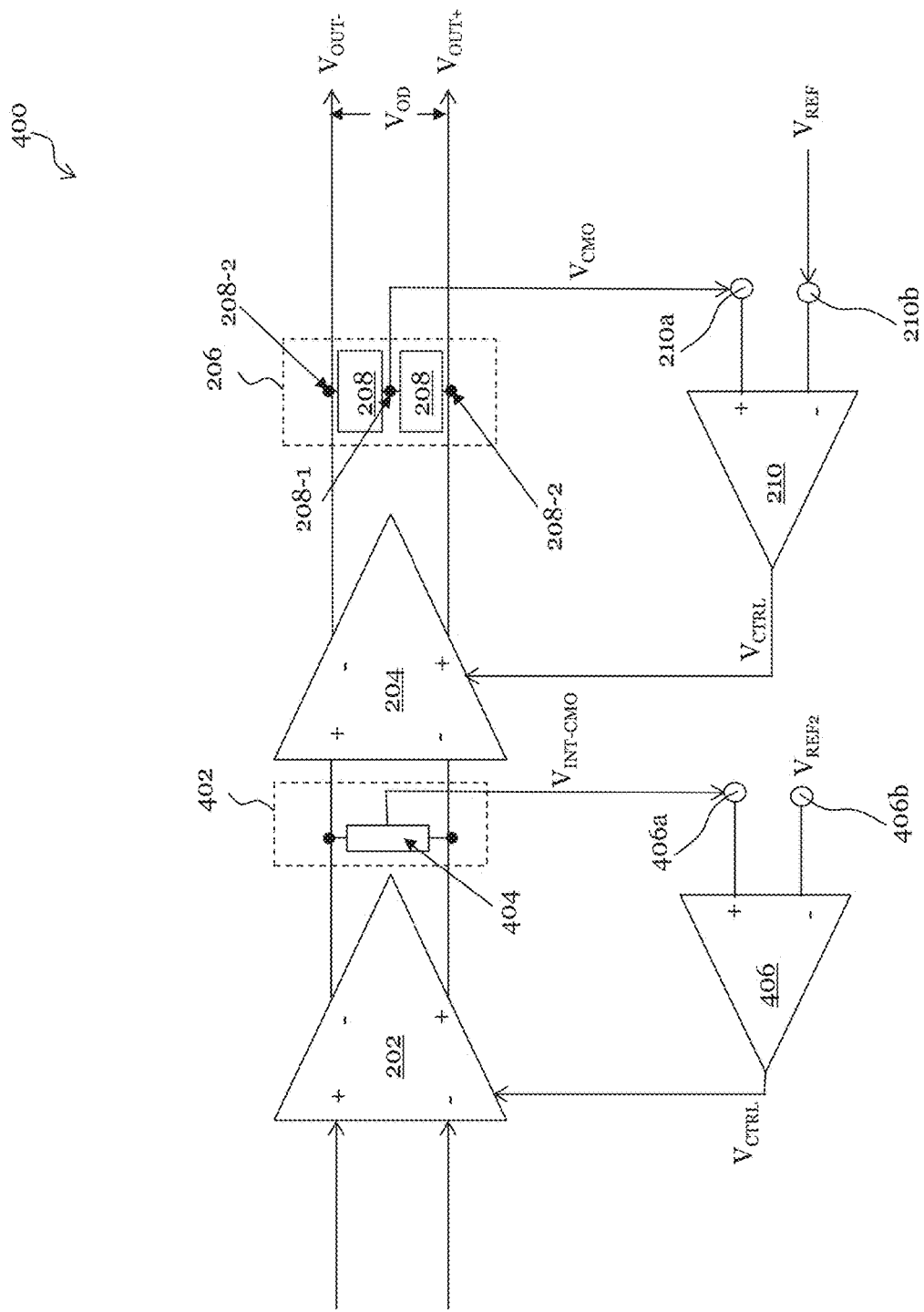
FIG. 4 shows a second example circuit of the op-amp shown in FIG. 1.

FIG. 4 shows a second example of the internal circuitry 400 of op-amp 101. As shown in FIG. 4, internal circuitry 400 includes first stage 202 (e.g. high gain stage) and second stage 204 (e.g. low gain stage). In contrast to internal circuitry 200 shown in FIG. 2, internal circuitry 400 includes a CMFB loop for each stage. For example, in FIG. 4, common-mode detector 206 and CMFB amplifier 210 form a CMFB loop for second stage 204 (and not for first stage 202, as depicted in FIG. 2). Internal circuitry 400 also includes second common-mode detector 402 and second common-mode feedback (CMFB) amplifier 406, which form a CMFB loop for first stage 202.

Second common-mode detector 402 may be coupled between the outputs of first stage 202. Illustratively, second common-mode detector 402 may have a first terminal coupled to (e.g. tied to) an inverting output of first stage 202 and a non-inverting input of second stage 204. Second common-mode detector 402 may also have a second terminal coupled to (e.g. tied to) a non-inverting output of first stage 202 and an inverting input of second stage 204. As a result, each of the output voltages of first stage 202 is fed as an input into second common-mode detector 402. The output voltages of first stage 202 are averaged by second common-mode detector 402 to yield an intermediate common-mode output voltage $V_{INT-CMO}$, which is an output of second common-mode detector 402. Similar to common-mode detector 206, second common-mode detector 402 may include impedance element 404, which may include one or more resistive elements, one or more capacitive elements, one or more differential difference amplifiers (DDA), combinations thereof, or the like.

Second CMFB amplifier 406 may include, or may be, an error amplifier. As shown in FIG. 4, second CMFB amplifier 406 receives intermediate common-mode output voltage $V_{INT-CMO}$ at a first input terminal 406a and a second reference voltage $V_{REF2}$ at a second input terminal 406b. Second CMFB amplifier 406 compares intermediate common-mode output voltage $V_{INT-CMO}$ with second reference voltage $V_{REF2}$, and adjusts a second control signal $V_{CTRL2}$ fed back to first stage 202 so that intermediate common-mode output voltage $V_{INT-CMO}$ is set or maintained at second reference voltage $V_{REF2}$. In the example of FIG. 4, a gain of CMFB amplifier 210 may be configured to be higher than a gain of second CMFB amplifier 406. As such, the low-gain stage of op-amp 101 (e.g. second stage 204) has CMFB loop (e.g. formed by common-mode detector 206 and CMFB amplifier 210) having a high gain, while the high-gain stage of op-amp 101 (e.g. first stage 202) has a CMFB loop (e.g. formed by second common-mode detector 404 and second CMFB amplifier 406) having a low gain.

Internal circuitry 400 has several disadvantages compared to internal circuitry 200 shown in FIG. 2. For example, due to additional circuit elements (such as second common-mode detector 404 and second CMFB amplifier 406) internal circuitry 400 occupies more area and consumes more power. Furthermore, since second common-mode detector 404 is coupled to outputs of a high gain stage 202, second common-mode detector 404 may act as a load that unnecessarily decreases the overall gain of op-amp 101. Even further, there may be uncertainty in what the second reference voltage $V_{ref2}$ has to be since process, voltage, and temperature (PVT) variations may require tracking that, in turn, may change the second reference voltage $V_{ref2}$. Additionally, there may be a larger common-mode error in the CMFB loop for first stage 202 by virtue of second CMFB amplifier 406 being a low gain error amplifier, and this may be undesirable for low voltage designs. Also, since there is a CMFB loop for each stage (e.g. multiple CMFP loops), differential loop settling is also negatively affected by second common-mode detector 404 and second CMFP amplifier 406.

In light of the description given above in respect of FIGS. 1 to 4, there may be a need for a CMFB circuit for a differential amplifier that has a stable CMFB loop and that, in comparison to internal circuitry 200 and 400, is simple in architecture, occupies less area, consumes less power, does not consume extra power in order to stabilize the CMFB loop, has small common-mode error, has a high-gain error amplifier, and in which differential settling of the CMFB loop is not affected.

Figure 5:
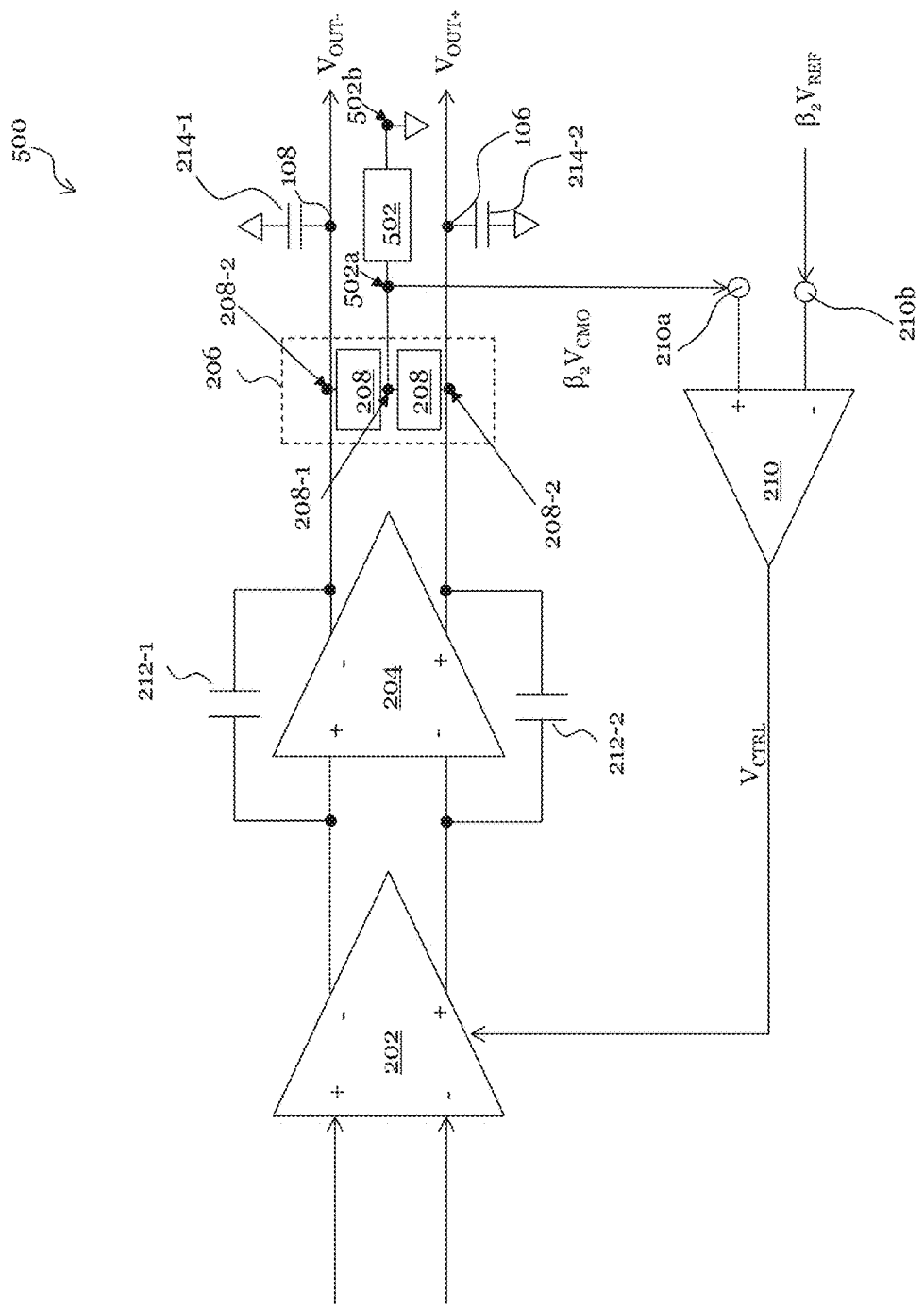
FIG. 5 schematically shows a circuit including an op-amp, a common-mode detector, a common-mode feedback amplifier, and an impedance element, where impedance element and common-mode detector form a voltage-divider circuit, in accordance with an embodiment.

FIG. 5 schematically shows a circuit 500 including first stage 202, second stage 204, common-mode detector 206, CMFB amplifier 210, and an impedance element 502, where impedance element 502 and common-mode detector 206 form a voltage-divider circuit, in accordance with an embodiment. Circuit 500 includes a CMFB circuit for op-amp 101 that has a stable CMFB loop and that, in comparison to internal circuitry 200 and 400, is simple in architecture, occupies less area, consumes less power, does not consume extra power in order to stabilize the CMFB loop, has small common-mode error, has a high-gain error amplifier, and in which differential settling of the CMFB loop is not affected.

Impedance element 502 can be a resistive element, a capacitive element (e.g. a switched capacitor), an inductive element, or combinations thereof. In some embodiments, impedance element 502 can include one or more resistors connected in series or in parallel, one or more capacitors connected in series or in parallel, or a combination thereof. As shown in FIG. 5, impedance element 502 may have a first terminal 502a coupled to (e.g. tied to) first terminals 208-1 of the first one and the second one of impedance elements 208 that are tied to each other. As such, first terminal 502a of impedance element 502 may be coupled to (e.g. tied to) first input terminal 210a of CMFB amplifier 210. A second terminal 502b of impedance element 502 may be coupled to (e.g. tied to) a supply voltage (which can be a ground potential, as depicted in FIG. 5).

As described above in relation to FIG. 2, the common-mode voltage component of the voltage outputted at both the non-inverting output (e.g. $V_{OUT+}$) and the inverting output (e.g. $V_{OUT-}$) of second stage 204 is $V_{CMO}$. Assuming that the impedances of each of impedance elements 208 is Z1 and the impedance of impedance element 502 is Z2, then the common-mode voltage that is provided to first input terminal 210a of CMFB amplifier 210 can be calculated by equaling the direct current (DC) current flowing or charge transfer through the impedance Z1∥Z1 and Z2 expressed as $\beta_2 V_{CMO}$, where $\beta_2$ is equal to Z2/(Z2+(Z1/2)).

As a result in the change in voltage that is provided to CMFB amplifier 210, the voltage at second input terminal 210b of CMFB amplifier 210 has to be scaled by a factor equal to about $\beta_2$. As such, as shown in FIG. 5, common-mode reference voltage $V_{REF}$ at second input terminal 210b of CMFB amplifier 210 is scaled by factor $\beta_2$. By doing so, control signal $V_{CTRL}$ is adjusted based on a comparison of $\beta_2 V_{CMO}$ and $\beta_2 V_{REF}$, and this control signal $V_{CTRL}$ is fed back to first stage 202 so that common-mode output voltage $V_{CMO}$ at each of the outputs of second stage 204 is set or maintained at the common-mode reference voltage $V_{REF}$. As can be seen from the expression for $\beta_2$, the magnitude of $\beta_2$ is less than 1. For example, the magnitude of $\beta_2$ may be less than 1. Consequently, a feedback factor $\beta_2$ is introduced using impedance element 502 so that stability of the single CMFB loop (e.g. formed by common-mode detector 206, impedance element 502, and CMFB amplifier 210) is achieved. Since no additional CMFB loops are used in circuit 500, stability is achieved with simple architecture, small circuit real estate, and low power consumption (e.g. in comparison to internal circuitry 200 and 400).

It is noted that in the example shown in FIG. 5, load capacitors 214-1 and 214-2 and miller-compensation capacitors 212-1, 212-2 are included in circuit 600. However, in other embodiments, these elements may not be included. Nonetheless, in such embodiments, the voltage-divider formed by impedance element 502 and common-mode detector 206 are still present in order to feed, to CMFB amplifier 210, a fraction $\beta_2$ of common-mode output voltage $V_{CMO}$.

Figure 6A:
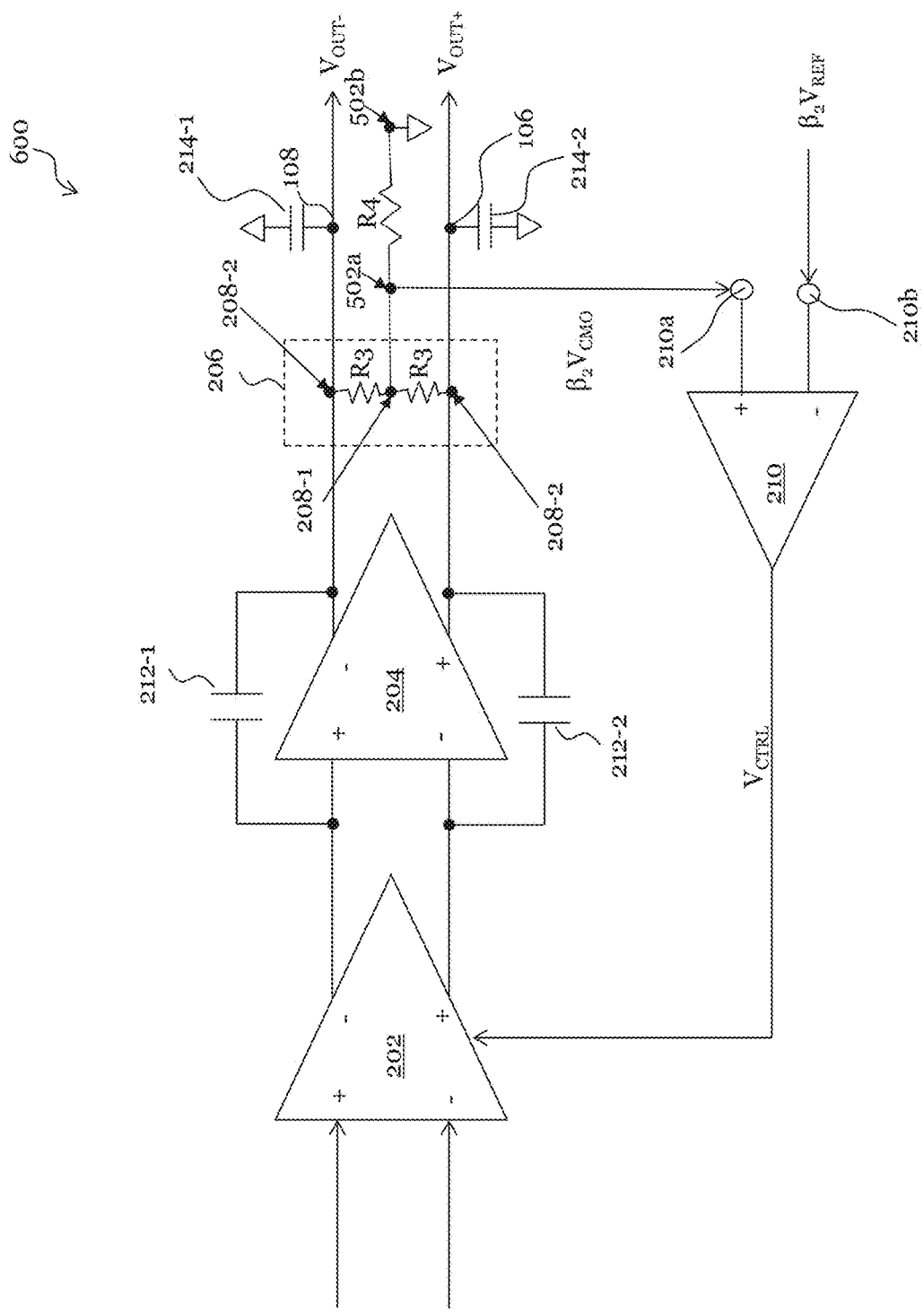
FIG. 6A schematically shows a circuit in which the common-mode detector and the impedance element of FIG. 5 are implemented using resistive elements, in accordance with an embodiment.
Figure 6B:
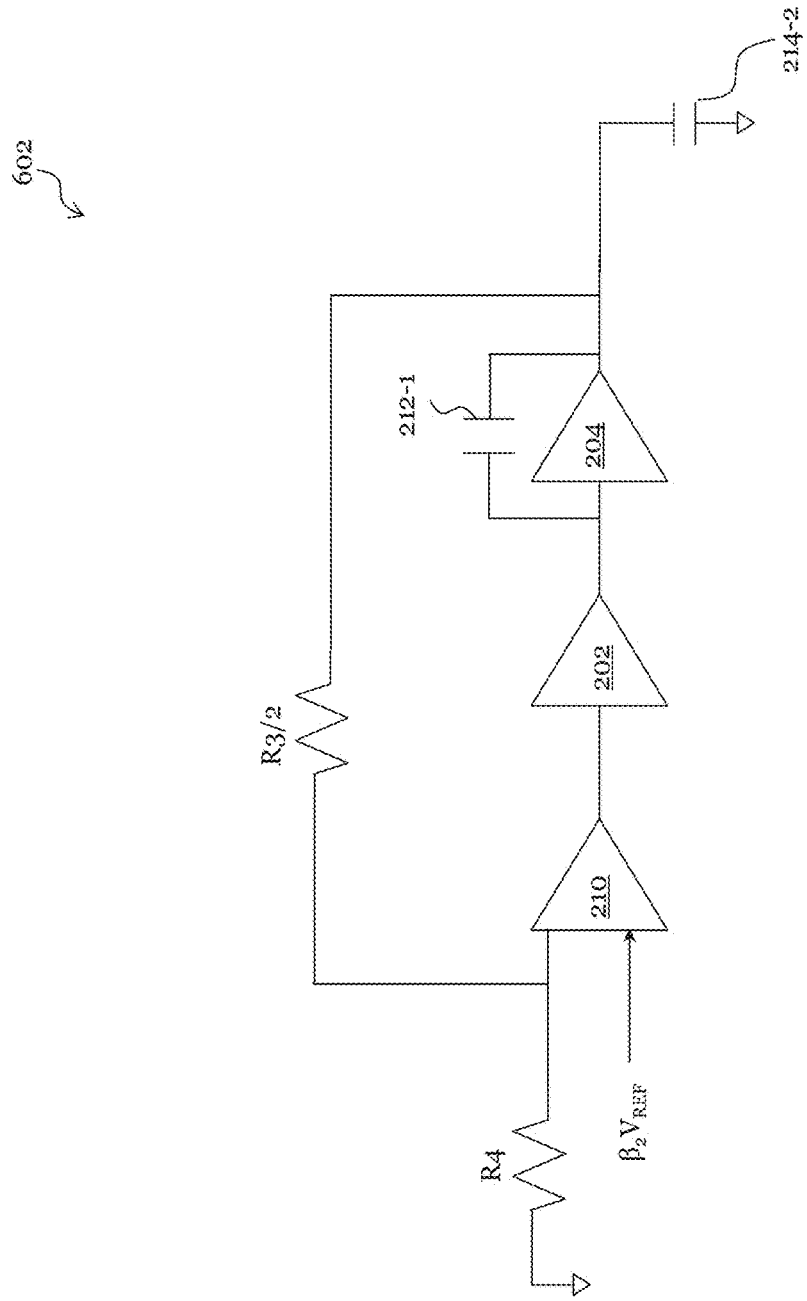
FIG. 6B schematically shows the common mode equivalent circuit of the op-amp in FIG. 6A, in accordance with an embodiment.

FIGS. 6A and 6B schematically show circuits 600 and 602 in which common-mode detector 206 and impedance element 502 are implemented using resistive elements, in accordance with an embodiment. Circuit 602, shown in FIG. 6B, is a common-mode equivalent circuit of circuit 600 shown in FIG. 6A. As shown in FIG. 6A, impedance elements 208 of common-mode detector 206 are resistive elements, each having a resistance R3, while impedance element 502 is also a resistive element having a resistance R4. In such an example, $\beta_2$ is equal to R4/(R4+(R3/2)), and this fraction of common-mode output voltage $V_{CMO}$ is fed as an input to CMFB amplifier 210. As depicted in FIGS. 6A and 6B, common-mode reference voltage $V_{REF}$ at second input terminal 210b of CMFB amplifier 210 is scaled by factor R4/(R4+(R3/2)). By doing so, control signal $V_{CTRL}$ is adjusted based on a comparison of $\beta_2 V_{CMO}$ and $\beta_2 V_{REF}$, and this control signal $V_{CTRL}$ is fed back to first stage 202 so that common-mode output voltage $V_{CMO}$ at each of the outputs of second stage 204 is set or maintained at the common-mode reference voltage $V_{REF}$. It is noted that in the example shown in FIGS. 6A and 6B, load capacitors 214-1 and 214-2 and miller-compensation capacitors 212-1, 212-2 are included in circuits 600 and 602. However, in other embodiments, these elements may not be included. Nonetheless, in such embodiments, the voltage-divider formed by impedance element 502 and common-mode detector 206 are still present in order to feed, to CMFB amplifier 210, a fraction $\beta_2$ of common-mode output voltage $V_{CMO}$ that is outputted at the output terminals of second stage 204.

Figure 7:
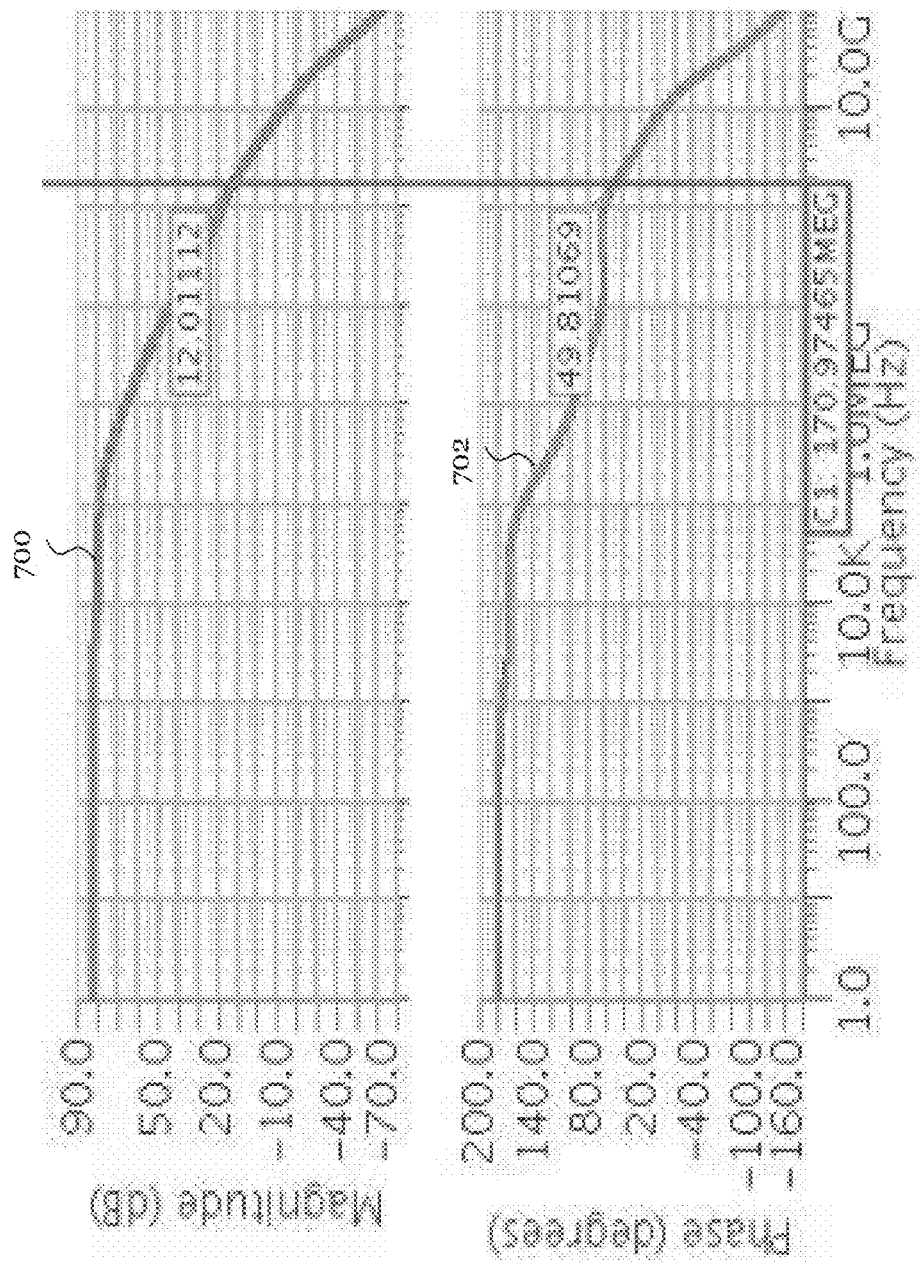
FIG. 7 shows a common mode frequency response of the circuit shown in FIGS. 6A and 6B, in accordance with an embodiment.

FIG. 7 shows a common mode frequency response of circuits 600 and 602 shown in FIGS. 6A and 6B, in accordance with an embodiment. The common mode frequency response of circuits 600 and 602 include a magnitude response 700 and a phase response 702. The horizontal axes of both magnitude response 700 and phase response 702 are logarithmic scales indicating frequency in Hertz. The vertical axis of magnitude response 700 is a linear scale indicating gain in decibels, while the vertical axis of phase response 702 is a linear scale indicating phase in degrees. The magnitude response 700 and the phase response 702 show that a phase margin of op-amp 101 (e.g. the value of the phase when gain is 12 (1/β) dB) is between about 45 degrees and about 60 degrees. Since a phase margin of about 45 degrees or more (e.g. about 50 degrees or more) may be needed for stability, op-amp 101 of circuits 600 and 602 may have a stable feedback loop.

Figure 8:
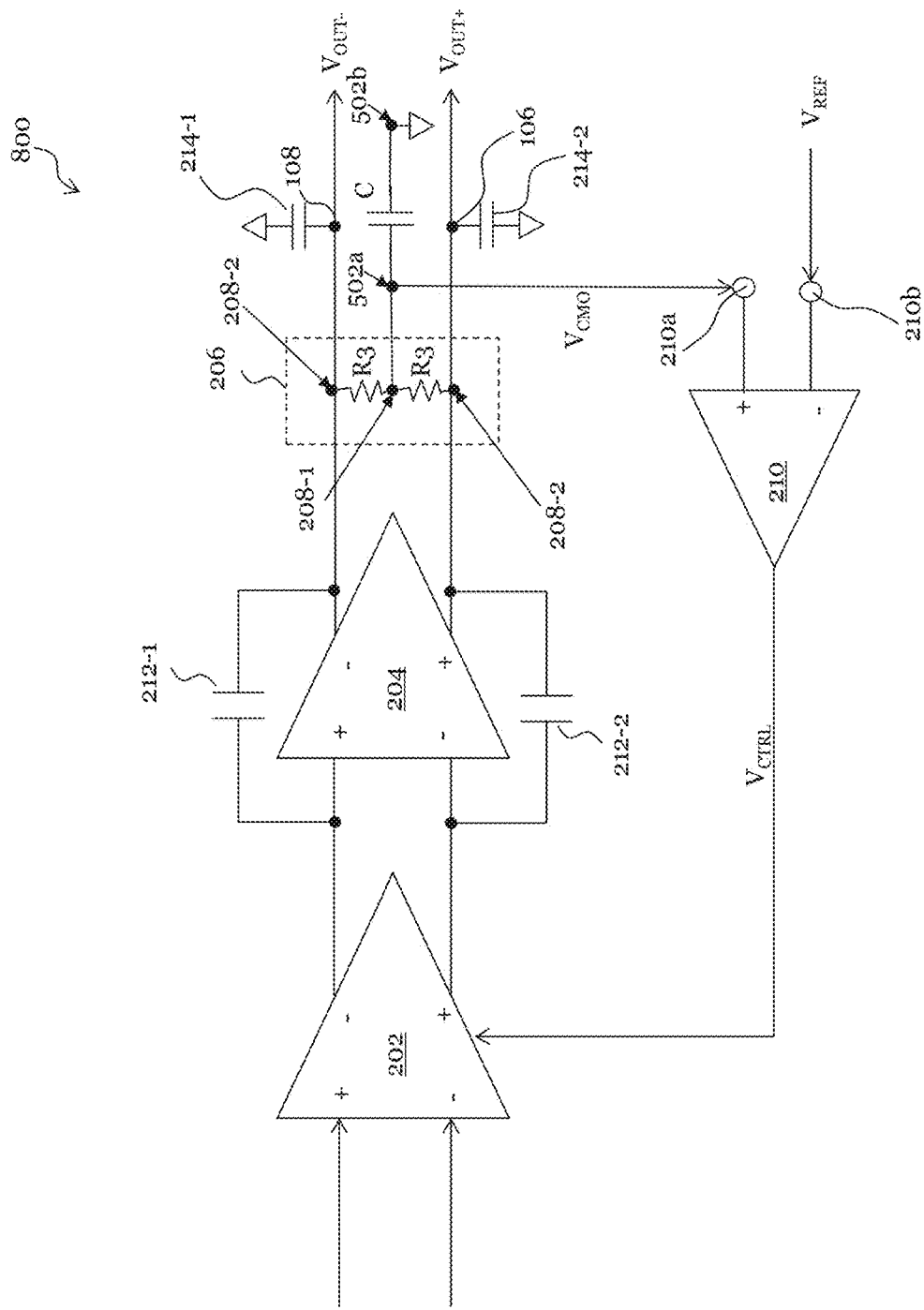
FIG. 8 schematically shows a circuit in which the common-mode detector of FIG. 5 is implemented using resistive elements, and the impedance element of FIG. 5 is implemented using a capacitive element, in accordance with an embodiment.

FIG. 8 schematically shows a circuit 800 in which common-mode detector 206 is implemented using resistive elements, and impedance element 502 is implemented using a capacitive element, in accordance with an embodiment. As shown in FIG. 8, impedance elements 208 of common-mode detector 206 are resistive elements, each having a resistance R3, while impedance element 502 is a capacitive element having a capacitance C. In such an example, $\beta_2$ is equal to 1/(1+jωCR3/2), where j denotes an imaginary unit in which $j^2 = -1$. The common-mode output voltage $V_{CMO}$ is, in general, a DC offset voltage on which output differential voltage $V_{OD}$ is carried (e.g. recalling FIG. 2 above, with $V_{OUT+}$ being expressed as $(V_{CMO}+V_{OD}/2)$, and $V_{OUT-}$ being expressed as $(V_{CMO}-V_{OD}/2)$). As such ω=0 for common-mode output voltage $V_{CMO}$, and $\beta_2$ is equal to 1. In such an example, capacitive element 502 appears as an open circuit to common-mode output voltage $V_{CMO}$ outputted from second stage 204, and the common-mode output voltage $V_{CMO}$, in its entirety, is fed as an input to CMFB amplifier 210. As depicted in FIG. 8, common-mode reference voltage $V_{REF}$ at second input terminal 210b of CMFB amplifier 210 is still scaled by factor $\beta_2$, although in this case $\beta_2 = 1$. Using a capacitive element in impedance element 502 creates a zero in the frequency response of circuit 800. Consequently, even though control signal $V_{CTRL}$ in FIG. 8 is adjusted based on a comparison of $V_{CMO}$ and $V_{REF}$, just as in circuits 200 and 400, the phase margin of circuit 800 is increased because of the zero created by capacitive element of impedance element 502. As a result, op-amp 101 of circuit 800 may have a stable feedback loop. This effect is discussed in greater detail below in respect of FIG. 9. It is noted that in the example shown in FIG. 8, load capacitors 214-1 and 214-2 and miller-compensation capacitors 212-1, 212-2 are included in circuit 800 However, in other embodiments, these elements may not be included. Nonetheless, in such embodiments, common-mode detector 206 and the capacitive element of impedance element 502 are still present in order to create a zero to increase the phase margin of circuit 800.

Figure 9:
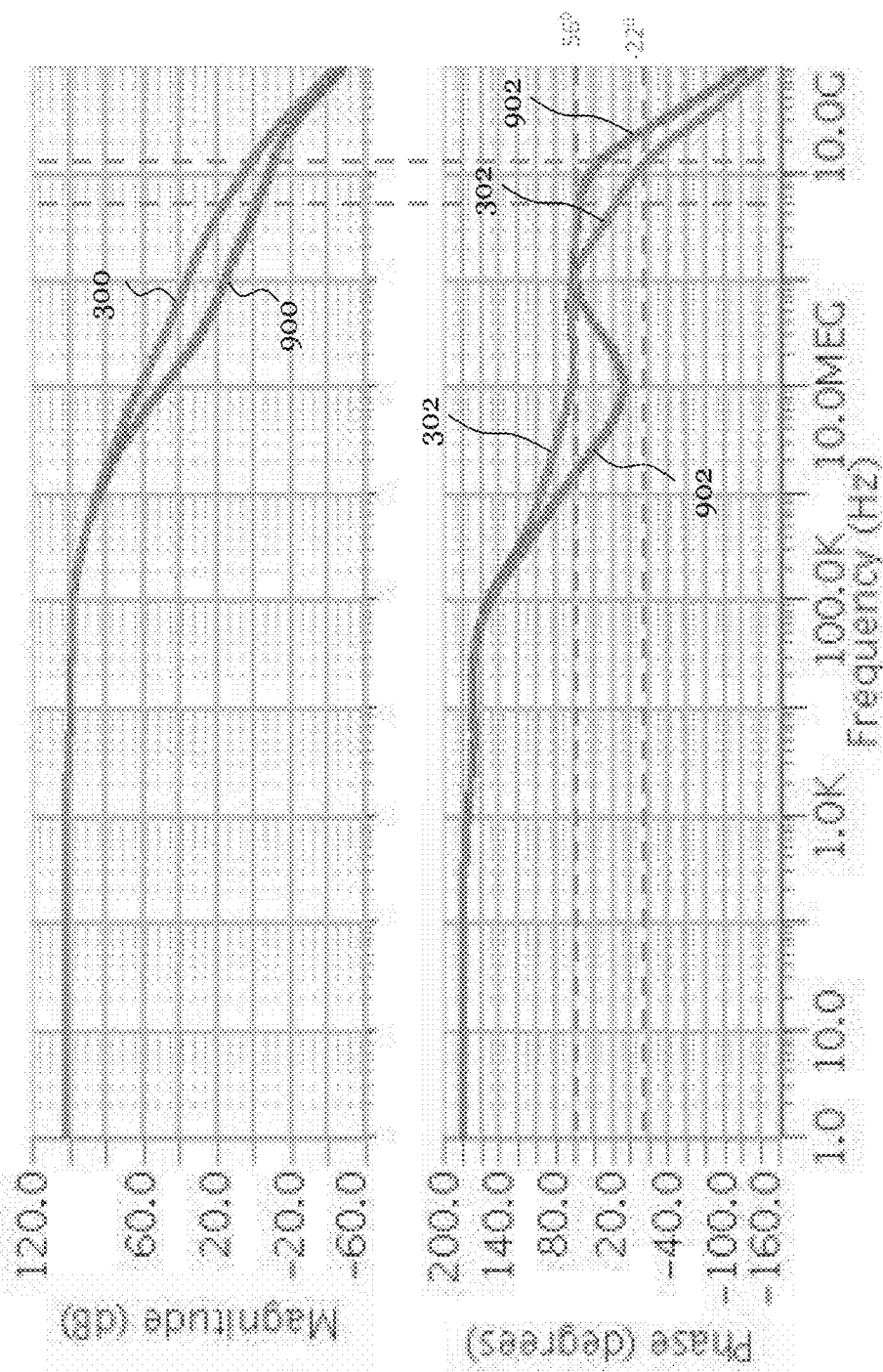
FIG. 9 shows a frequency response of the circuit shown in FIG. 8, in accordance with an embodiment.

FIG. 9 shows a common mode frequency response of circuit 800 shown in FIG. 8, in accordance with an embodiment. In particular, circuit 800 has a magnitude response 900 and a phase response 902. The horizontal axes of both magnitude response 900 and phase response 902 are logarithmic scales indicating frequency in Hertz. The vertical axis of magnitude response 900 is a linear scale indicating gain in decibels, while the vertical axis of phase response 902 is a linear scale indicating phase in degrees. Magnitude response 900 of circuit 800 is plotted on the same axis as the magnitude response 300 of internal circuitry 200, for ease of comparison. In like manner, phase response 902 of circuit 800 is plotted on the same axis as the phase response 302 of internal circuitry 200, for ease of comparison. As shown in FIG. 9, phase margin is increased from about –22 degrees in phase response 302 to between about 50 degrees and about 60 degrees (e.g. about 56 degrees) in phase response 902. This can be attributed to the zero created by capacitive element of impedance element 502. Since a phase margin of about 45 degrees or more (e.g. about 50 degrees or more) may be needed for stability, op-amp 101 of circuits 600 and 602 may have a stable feedback loop. Also shown in FIG. 9, magnitude response 900 has a slightly smaller bandwidth, and the frequency at which unity gain is achieved (e.g. 0 dB line) decreases from about 1.5 GHz to about 450 MHz.

Consequently, use of impedance element 502 in a CMFB circuit of an op-amp (e.g. a differential amplifier) can provide a CMFB circuit for a differential amplifier that has a stable CMFB loop and that, in comparison to conventional CMFB methods, is simple in architecture, occupies less area, consumes less power, does not consume extra power in order to stabilize the CMFB loop, has small common-mode error, has a high-gain error amplifier, and in which settling of the differential loop is not affected. As an example, an area occupied by circuit 500 is approximately one quarter the area occupied by conventional CMFB circuits. As another example, power consumption of circuit 500 is approximately one quarter the power consumed by conventional CMFB circuits.

According to an embodiment, a circuit includes an operational amplifier having a first output terminal and a second output terminal. The circuit further includes a detector coupled between the first output terminal and the second output terminal of the operational amplifier. The detector is configured to detect a common-mode output voltage at the first output terminal and the second output terminal of the operational amplifier. The circuit also includes a feedback amplifier having a first input terminal coupled to the detector and a second input terminal configured to receive a reference voltage. The feedback amplifier is configured to generate a feedback signal based on the common-mode output voltage and the reference voltage and to provide the feedback signal to the operational amplifier. The circuit additionally includes an impedance element having a first terminal coupled to the first input terminal of the feedback amplifier and a second terminal coupled to a supply voltage.

According to an embodiment, a method includes detecting a common-mode output voltage at a first output terminal and a second output terminal of an operational amplifier, and attenuating the common-mode output voltage according to a voltage division to produce an attenuated common-mode output voltage. The method further includes generating a control signal based on a comparison of the attenuated common-mode output voltage with a reference voltage generated according to the voltage division, and providing the control signal to the operational amplifier, where the operational amplifier is configured to vary the common-mode output voltage based on the control signal.

According to an embodiment, a circuit includes a differential amplifier having a first output terminal and a second output terminal. The differential amplifier has a first stage configured to receive an input voltage, and a second stage configured to amplify an output of the first stage and generate an output signal at the first output terminal and the second output terminal of the differential amplifier. The circuit also includes a common-mode detector coupled between the first output terminal and the second output terminal. The common-mode detector is configured to detect a common-mode output voltage of the output signal at a first pair of input terminals of the common-mode detector. The circuit further includes an impedance element coupled between an output node of the common-mode detector and an supply voltage and an error amplifier having a first terminal coupled to the output node of the common-mode detector. The error amplifier is configured to receive a reference voltage at a second terminal of the error amplifier, where the error amplifier is further configured to provide a control signal to the first stage of the differential amplifier based on a difference between the reference voltage and a voltage at the output node of the common-mode detector Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The devices and processing systems described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a processor, a digital signal processor (DSP), an Application Specific Integrated Circuit (ASIC), a field programmable gate array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit, comprising:
    an operational amplifier having a first output terminal and a second output terminal;
    a detector coupled between the first output terminal and the second output terminal of the operational amplifier, the detector configured to detect a common-mode output voltage at the first output terminal and the second output terminal of the operational amplifier;
    a feedback amplifier having a first input terminal coupled to the detector and a second input terminal configured to receive a reference voltage, the feedback amplifier configured to generate a feedback signal based on the common-mode output voltage and the reference voltage, and to provide the feedback signal to the operational amplifier; and
    an impedance element having a first terminal coupled to the first input terminal of the feedback amplifier and a second terminal coupled to a supply voltage, wherein the operational amplifier comprises a first fully differential stage comprising an inverting output and a non-inverting output, wherein the operational amplifier further comprises a second fully differential stage comprising a non-inverting input and an inverting input, wherein the inverting output of the first fully differential stage is tied to the non-inverting input of the second fully differential stage without intervening circuitry, and wherein the non-inverting output of the first fully differential stage is tied to the inverting input of the second fully differential stage without intervening circuitry.

2. The circuit of claim 1, wherein the first terminal of the impedance element is tied to a node of the detector configured to output the common-mode output voltage.

3. The circuit of claim 1, wherein the impedance element and the detector are configured to form a voltage-divider circuit configured to provide, to the feedback amplifier, an attenuation of the common-mode output voltage at the first output terminal and the second output terminal of the operational amplifier.

4. The circuit of claim 3, wherein the reference voltage is generated according to a voltage division proportional to the attenuation.

5. The circuit of claim 1, wherein the feedback signal is provided to the first stage of the operational amplifier.

6. The circuit of claim 1, wherein the detector comprises:
a first resistor having a first terminal coupled to the first output terminal of the operational amplifier; and
a second resistor having a first terminal coupled to the second output terminal of the operational amplifier, the second resistor having a second terminal coupled to a second terminal of the first resistor, wherein the second terminals of the first resistor and the second resistor form a node, and wherein resistance values of the first resistor and the second resistor are substantially equal.

7. The circuit of claim 6, wherein the first terminal of the impedance element is tied to the node and the first input terminal of the feedback amplifier.

8. The circuit of claim 1, wherein the impedance element comprises a capacitive element configured to create a zero in a frequency response of a common mode feedback loop of the circuit.

9. The circuit of claim 1, wherein the first output terminal and the second output terminal of the operational amplifier comprise an inverting output and a non-inverting output of the second fully differential stage, respectively.

10. The circuit of claim 9, further comprising a first compensation capacitor coupled between the non-inverting input of the second fully differential stage and the inverting output of the second fully differential stage, and a second compensation capacitor coupled between the inverting input of the second fully differential stage and the non-inverting output of the second fully differential stage.

11. A method, comprising:
detecting a common-mode output voltage at a first output terminal and a second output terminal of an operational amplifier;
attenuating the common-mode output voltage according to a voltage division to produce an attenuated common-mode output voltage;
generating a control signal based on a comparison of the attenuated common-mode output voltage with a reference voltage generated according to the voltage division; and
providing the control signal to the operational amplifier, wherein the operational amplifier is configured to vary the common-mode output voltage based on the control signal, wherein the operation amplifier comprises a high-gain fully differential stage and a low-gain fully differential stage, wherein the high-gain fully differential stage comprises an inverting output and a non-inverting output, wherein the low-gain fully differential stage comprises a non-inverting input and an inverting input, wherein the inverting output of the high-gain fully differential stage is tied to the non-inverting input of the low-gain fully differential stage without intervening circuitry, and wherein the non-inverting output of the high-gain fully differential stage is tied to the inverting input of the low-gain fully differential stage without intervening circuitry.

12. The method of claim 11, wherein providing the control signal to the operational amplifier comprises providing the control signal to the high-gain stage of the operational amplifier.

13. The method of claim 11, wherein detecting the common-mode output voltage at the first output terminal and the second output terminal of the operational amplifier comprises:
coupling a common-mode detector between the first output terminal and the second output terminal of the operational amplifier, the common-mode detector configured to output the common-mode output voltage at an output node of the common-mode detector.

14. The method of claim 13, wherein attenuating the common-mode output voltage according to the voltage division comprises:
coupling a first terminal of an impedance element to the output node and a second terminal of the impedance element to a ground potential, wherein the attenuated common-mode output voltage is generated at the first terminal of the impedance element.

15. A circuit, comprising:
a differential amplifier having a first output terminal and a second output terminal, the differential amplifier having a first stage configured to receive an input voltage, and a second stage configured to amplify an output of the first stage and generate an output signal at the first output terminal and the second output terminal of the differential amplifier;
a common-mode detector coupled between the first output terminal and the second output terminal, the common-mode detector configured to detect a common-mode output voltage of the output signal at a first pair of input terminals of the common-mode detector;
an impedance element coupled between an output node of the common-mode detector and a supply voltage; and
an error amplifier having a first terminal coupled to the output node of the common-mode detector, the error amplifier configured to receive a reference voltage at a second terminal of the error amplifier, wherein the error amplifier is further configured to provide a control signal to the first stage of the differential amplifier based on a difference between the reference voltage and a voltage at the output node of the common-mode detector, wherein the first stage of the differential amplifier comprises an inverting output and a non-inverting output, wherein the second stage of the differential amplifier comprises a non-inverting input and an inverting input, wherein the inverting output of the first stage of the differential amplifier is tied to the non-inverting input of the second stage of the differential amplifier without intervening circuitry, and wherein the non-inverting output of the first stage of the differential amplifier is tied to the inverting input of the second stage of the differential amplifier without intervening circuitry.

16. The circuit of claim 15, wherein the control signal is configured to vary an output current of the differential amplifier.

17. The circuit of claim 15, wherein the control signal is configured to vary the common-mode output voltage of the output signal.

18. The circuit of claim 15, wherein the supply voltage comprises a ground potential.

19. The circuit of claim 15, wherein the impedance element comprises at least one of a resistive element or a capacitive element.

20. The circuit of claim 15, wherein the impedance element increases a phase margin of the circuit.

21. The circuit of claim 15, wherein a phase margin of the circuit is in a range from about 45 degrees to about 70 degrees.

22. The circuit of claim 15, wherein a phase margin of the circuit is greater than 50 degrees.

* * * * *